(12) United States Patent
Wu

(10) Patent No.: US 9,352,380 B2
(45) Date of Patent: May 31, 2016

(54) THERMAL MODULE AND MANUFACTURING METHOD THEREOF

(71) Applicant: Asia Vital Components Co., Ltd., New Taipei (TW)

(72) Inventor: Chun-Ming Wu, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 554 days.

(21) Appl. No.: 14/037,947

(22) Filed: Sep. 26, 2013

(65) Prior Publication Data

US 2014/0020248 A1    Jan. 23, 2014

Related U.S. Application Data

(62) Division of application No. 13/090,559, filed on Apr. 20, 2011, now abandoned.

(51) Int. Cl.
*H05K 7/20*    (2006.01)
*B21D 53/02*    (2006.01)
*B21D 39/00*    (2006.01)
(Continued)

(52) U.S. Cl.
CPC ................ *B21D 53/02* (2013.01); *B21D 39/00* (2013.01); *B21D 53/08* (2013.01); *F28D 15/0275* (2013.01); *H01L 23/36* (2013.01); *H01L 23/427* (2013.01); *F28F 9/0131* (2013.01); *H01L 23/4006* (2013.01); *H01L 2924/0002* (2013.01); *Y10T 29/4935* (2015.01)

(58) Field of Classification Search
CPC ........ B21D 53/02; B21D 53/08; B21D 39/00; B21D 28/00; B21D 28/02; B21D 28/10; B21D 39/02; B21D 39/031; B21D 39/032; H01L 23/427; H01L 23/36; H01L 2924/0002; H01L 23/4006; H01L 23/3672; F28D 15/0275; Y10T 29/4935; F28F 9/0131; F28F 1/12
USPC .......... 165/78, 80.1, 80.2, 80.3, 80.4, 104.19, 165/104.21, 104.33
See application file for complete search history.

(56) References Cited

U.S. PATENT DOCUMENTS 2,688,794 A * 9/1954 Malutich ................ B21D 53/08
165/171
3,387,653 A * 6/1968 Coe .......................... F28F 1/12
165/165

(Continued)

FOREIGN PATENT DOCUMENTS

CN    102709261 A    10/2012
JP    200028280    1/2000

(Continued)

*Primary Examiner* — Christopher Besler
*Assistant Examiner* — Jun Yoo
(74) *Attorney, Agent, or Firm* — C. G. Mersereau; Nikolai & Mersereau, P.A.

(57) ABSTRACT

A thermal module and a manufacturing method thereof. The thermal module includes a retainer member and at least one heat conduction member. The retainer has a first clamping arm and a second clamping arm opposite to the first clamping arm. The heat conduction member is disposed and fixedly clamped between the first and second clamping arms. The retainer member is formed by means of punching and integrally connected with the heat conduction member also by means of punching so that the manufacturing cost of the thermal module is lowered and the heat dissipation efficiency of the thermal module is enhanced.

5 Claims, 7 Drawing Sheets

(51) Int. Cl.
    *B21D 53/08*         (2006.01)
    *F28D 15/02*         (2006.01)
    *H01L 23/36*         (2006.01)
    *H01L 23/427*        (2006.01)
    *F28F 9/013*         (2006.01)
    *H01L 23/40*         (2006.01)

(56) References Cited

U.S. PATENT DOCUMENTS

| | | | |
|---|---|---|---|
| 5,549,155 | A | 8/1996 | Meyer, IV et al. |
| 6,243,264 | B1 * | 6/2001 | Bollesen ............. H01L 23/4093 165/80.2 |
| 6,408,934 | B1 | 6/2002 | Ishida et al. |
| 6,625,021 | B1 | 9/2003 | Lofland et al. |
| 6,779,595 | B1 | 8/2004 | Chiang |
| 6,859,368 | B2 | 2/2005 | Yang |
| 6,945,319 | B1 | 9/2005 | Li et al. |
| 7,606,037 | B2 * | 10/2009 | Chang ................. H01L 23/4093 165/80.3 |

FOREIGN PATENT DOCUMENTS

| | | |
|---|---|---|
| TW | 584214 U | 4/2004 |
| TW | 591363 B | 6/2004 |
| TW | M284947 U | 1/2006 |
| TW | M310366 U | 4/2007 |
| TW | M395994 U | 1/2011 |
| TW | I410267 B | 10/2013 |

* cited by examiner

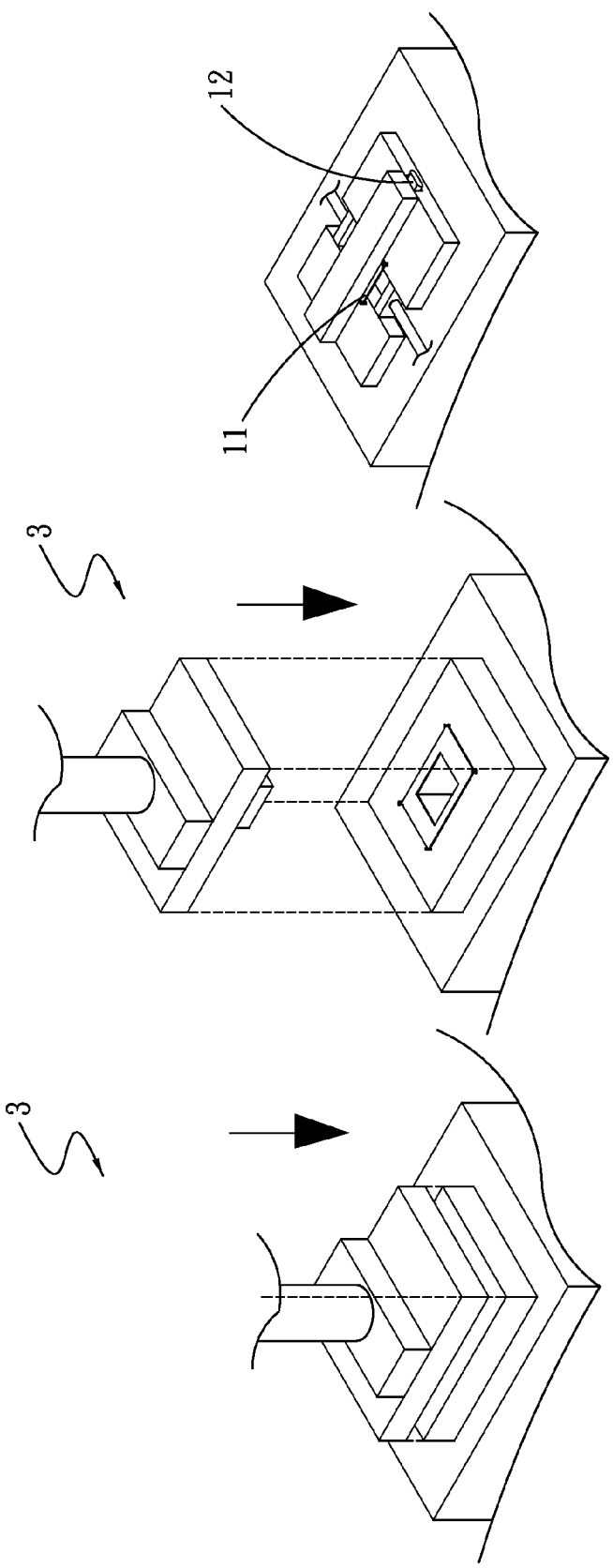

THERMAL MODULE AND MANUFACTURING METHOD THEREOF

CROSS-REFERENCE TO RELATED APPLICATIONS

The present application is a division of U.S. patent application Ser. No. 13/090,559, filed on Apr. 20, 2011, titled Thermal Module and Manufacturing Method Thereof, listing Chun-Ming Wu as inventor.

FIELD OF THE INVENTION

The present invention relates to a thermal module and a manufacturing method thereof, and more particularly to a thermal module manufactured at lower cost and a manufacturing method of the thermal module.

BACKGROUND OF THE INVENTION

A conventional thermal module is mainly composed of a heat dissipation base seat and heat pipes passing through the heat dissipation base seat. The heat pipes are generally securely affixed to the heat dissipation base seat by means of welding. However, in the case that the heat dissipation base seat and the heat pipes are made of different metal materials with different performances, (for example, the heat pipes are made of copper material, while the radiating fins are made of aluminum material), it will be hard to securely connect the heat dissipation base seat with the heat pipes. This is because an aluminum material can be hardly connected with other kinds of materials by means of common welding process. An aluminum material can be welded with another aluminum material by means of some special welding processes (such as argon welding). However, the aluminum material cannot be welded to a copper material with different performances by means of argon welding. Therefore, prior to the welding process, it is necessary first coat the aluminum-made radiating fins with a coating to facilitate the successive welding process. Such procedure is quite troublesome.

In some other cases, the heat dissipation base seat is formed with perforations or channels for receiving the heat pipes that are connected with the heat dissipation base seat. In such thermal module, the heat dissipation base seat is in contact with a heat source to absorb the heat generated by the heat source and then transfer the heat to the heat pipe. Such thermal module has a heat conduction efficiency much lower than that of a thermal module in which the heat pipes are in direct contact with the heat source. Moreover, the thermal module with the heat dissipation base seat has a heavier weight and larger volume and is manufactured at higher cost as a whole. It is inconvenient to install or transfer such thermal module. Therefore, such thermal module can be hardly applied to an electronic device with narrow interior space.

Therefore, the conventional thermal module has the following shortcomings:
1. The heat conduction efficiency is poor.
2. The manufacturing cost is higher.
3. The application site is limited.

SUMMARY OF THE INVENTION

A primary object of the present invention is to provide a thermal module, which has simplified structure and can be quickly assembled.

A further object of the present invention is to provide a manufacturing method of a thermal module. By means of the manufacturing method, the thermal module can be manufactured at lower cost.

To achieve the above and other objects, the thermal module of the present invention includes a retainer member and at least one heat conduction member. The retainer has a first clamping arm and a second clamping arm opposite to the first clamping arm. The heat conduction member is disposed and fixedly clamped between the first and second clamping arms.

To achieve the above and other objects, the manufacturing method of the thermal module of the present invention includes steps of: providing a metal board and at least one heat conduction member; primarily punching the metal board to form a first clamping arm and a second clamping arm; secondarily punching the metal board to form a retainer member with a predetermined profile; and placing the heat conduction member on one face of the formed retainer member and applying a force to the first and second clamping arms to bend the first and second clamping arms toward the heat conduction member to tightly hold the heat conduction member and connect the heat conduction member with the retainer member.

The thermal module has a simplified structure and lighter weight and can be easily directly assembled with the heat pipes.

By means of the manufacturing method, the thermal module can be manufactured at much lower cost.

Therefore, the present invention has the following advantages:
1. The thermal module of the present invention has simplified structure.
2. The thermal module of the present invention has better heat conduction efficiency.
3. The thermal module of the present invention is manufactured at lower cost.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 11 shows still another step of the manufacturing method of the thermal module of the present invention;

FIG. 12 shows still another step of the manufacturing method of the thermal module of the present invention; and FIG. 13 shows still another step of the manufacturing method of the thermal module of the present invention.

DETAILED DESCRIPTION OF THE PREFERRED EMBODIMENTS

Figure 1:
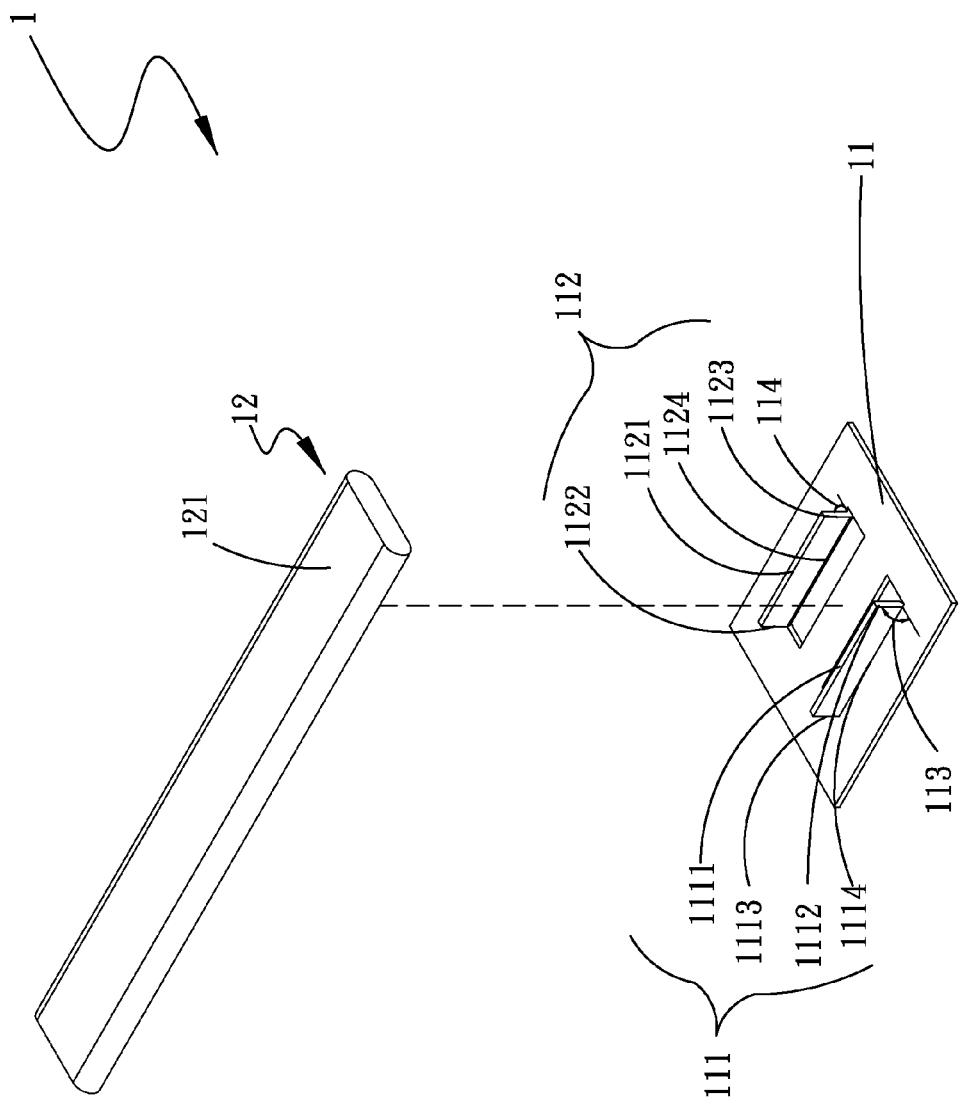
FIG. 1 is a perspective exploded view of a first embodiment of the thermal module of the present invention.
Figure 2:
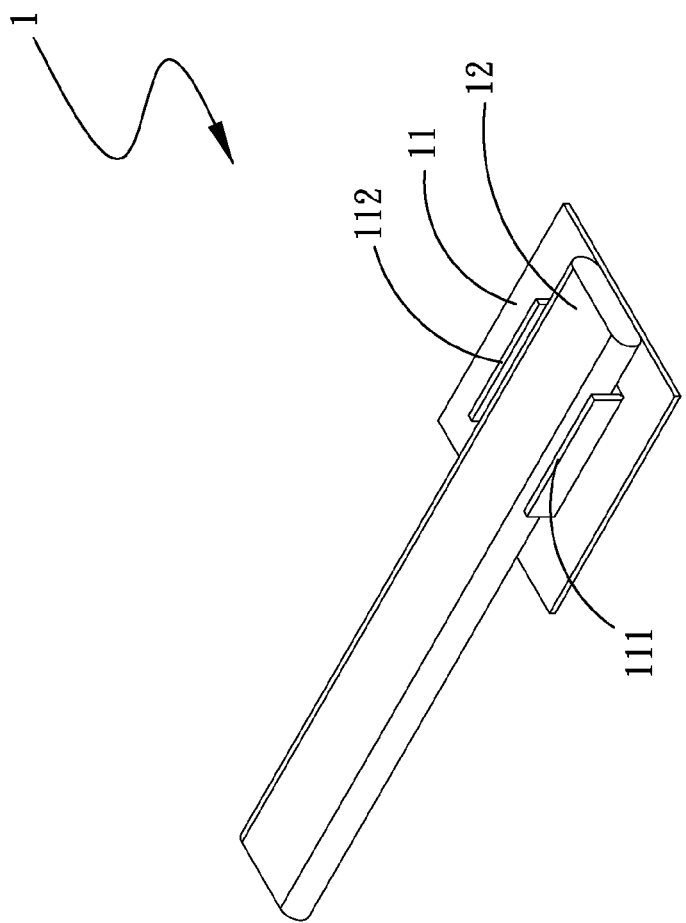
FIG. 2 is a perspective assembled view of the first embodiment of the thermal module of the present invention.

Please refer to FIGS. 1 and 2. FIG. 1 is a perspective exploded view of a first embodiment of the thermal module of the present invention. FIG. 2 is a perspective assembled view of the first embodiment of the thermal module of the present invention. According to the first embodiment, the thermal module 1 includes a retainer member 11 and at least one heat conduction member 12.

The retainer member 11 has a first clamping arm 111 and a second clamping arm 112 opposite to the first clamping arm 111.

The first clamping arm 111 and the retainer member 11 contain therebetween a first angle 113. The second clamping arm 112 and the retainer member 11 contain therebetween a second angle 114.

The first clamping arm 111 has a first free side 1111, a second free side 1112, a third free side 1113 and a first connection side 1114 connected with the retainer member 11. The second clamping arm 112 has a fourth free side 1121, a fifth free side 1122, a sixth free side 1123 and a second connection side 1124 connected with the retainer member 11.

The heat conduction member 12 has a heat absorption face 121. The heat conduction member 12 is disposed and fixedly clamped between the first and second clamping arms 111, 112, whereby the heat conduction member 12 and the retainer member 11 together form an integral body. The heat absorption face 121 is in direct contact with a heat source to enhance heat dissipation efficiency and lower manufacturing cost.

The heat conduction member 12 is a member selected from a group consisting of heat pipe, heat spreader, flat-plate heat pipe and heat conduction metal. In this embodiment, the heat conduction member 12 is, but not limited to, a heat pipe.

Figure 3:
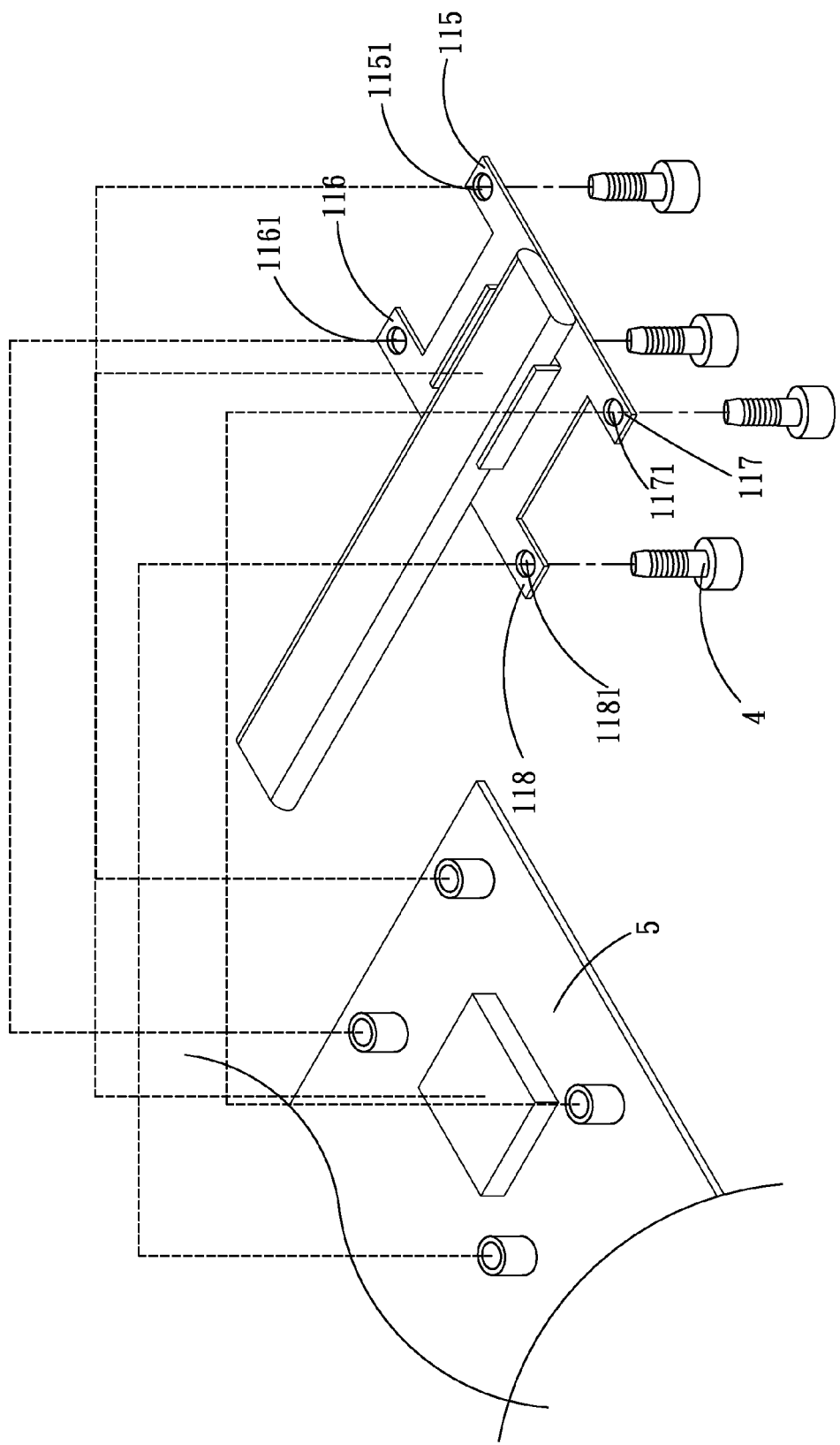
FIG. 3 is a perspective assembled view of a second embodiment of the thermal module of the present invention.

Please refer to FIG. 3, which is a perspective assembled view of a second embodiment of the thermal module of the present invention. The second embodiment is substantially identical to the first embodiment and thus will not be repeatedly described hereinafter. The second embodiment is only different from the first embodiment in that the retainer member 11 further has a first extension section 115, a second extension section 116, a third extension section 117 and a fourth extension section 118, which extend from the retainer member 11 in different directions. The first, second, third and fourth extension sections 115, 116, 117, 118 respectively have a first through hole 1151, a second through hole 1161, a third through hole 1171 and a fourth through hole 1181. Four fastening members 4 (such as screws) are respectively correspondingly passed through the through holes to fix the retainer member 11 on a chassis 5.

Figure 4:
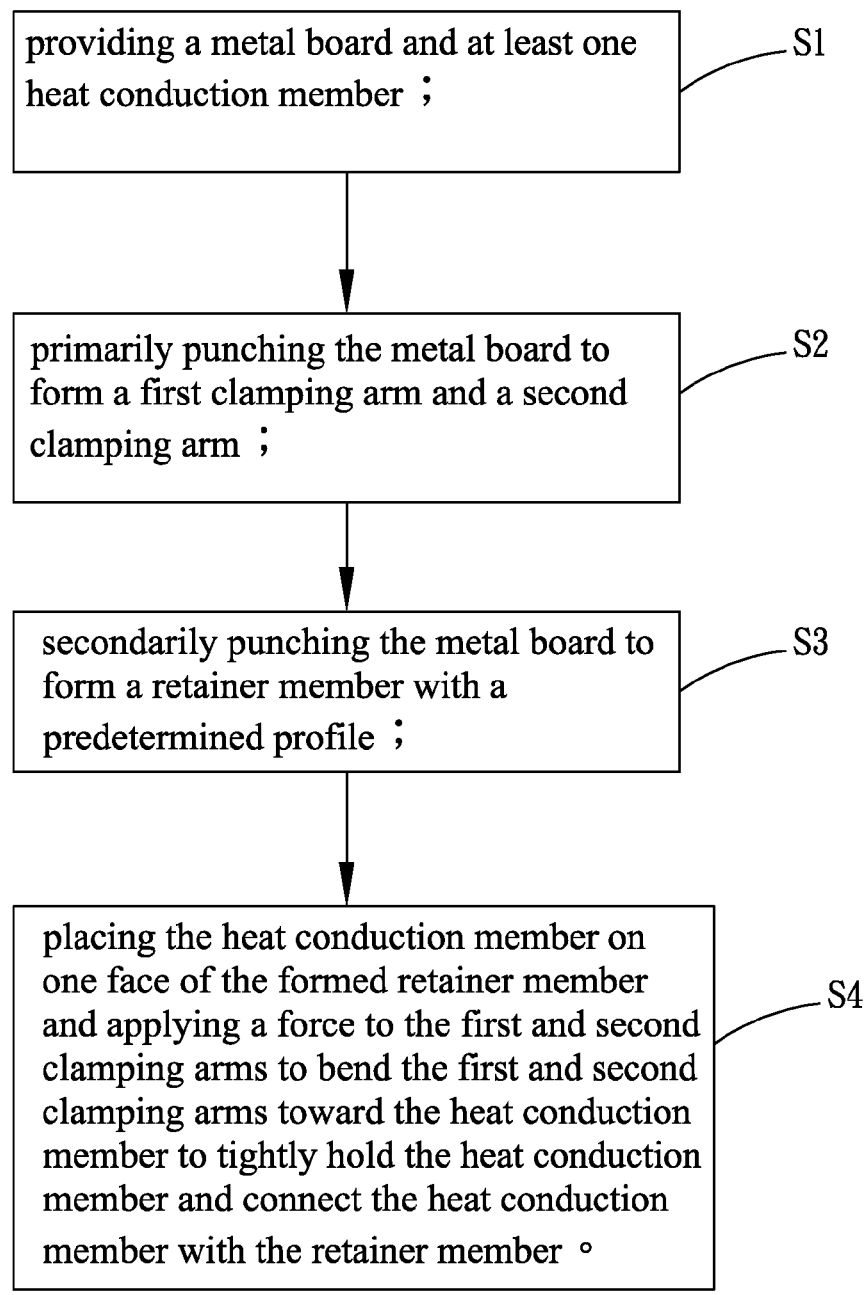
FIG. 4 is a flow chart of the manufacturing method of the thermal module of the present invention.
Figure 7:
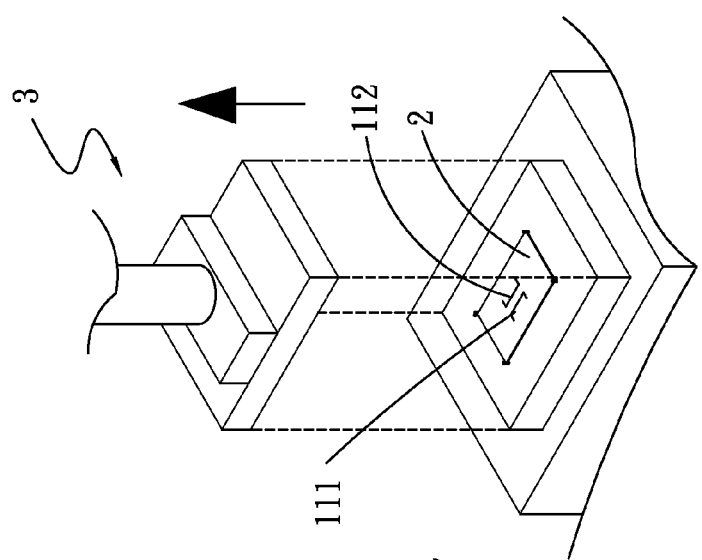
FIG. 7 shows still another step of the manufacturing method of the thermal module of the present invention.
Figure 6:
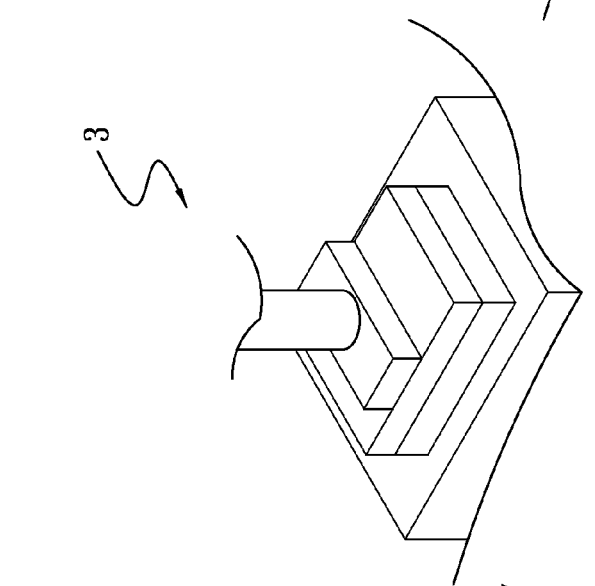
FIG. 6 shows another step of the manufacturing method of the thermal module of the present invention.
Figure 5:
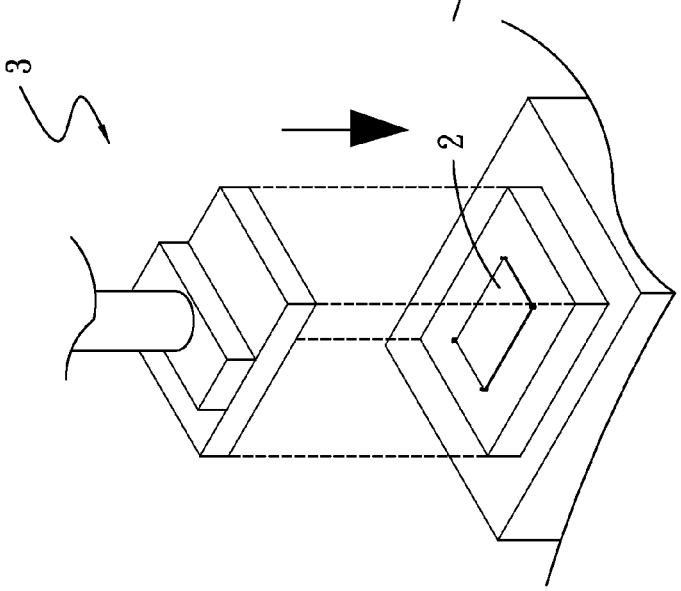
FIG. 5 shows a step of the manufacturing method of the thermal module of the present invention.
Figure 10:
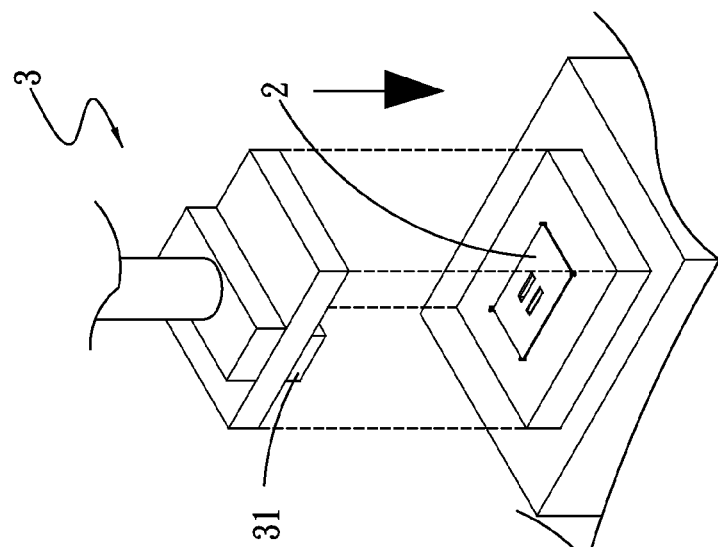
FIG. 10 shows still another step of the manufacturing method of the thermal module of the present invention.
Figure 9:
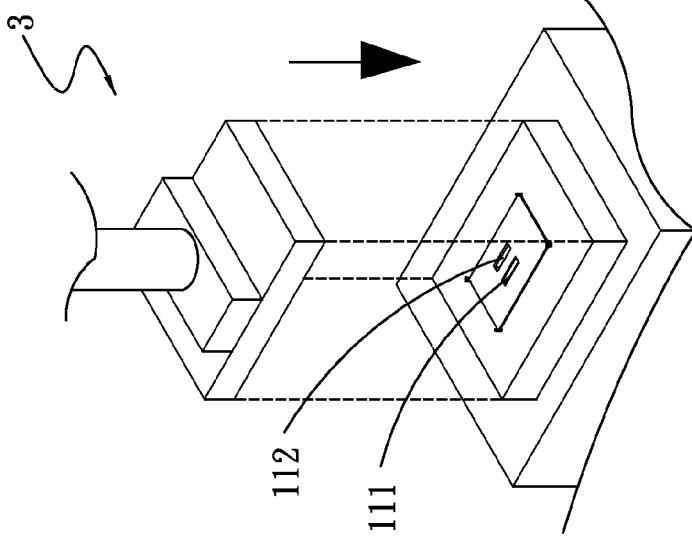
FIG. 9 shows still another step of the manufacturing method of the thermal module of the present invention.
Figure 8:
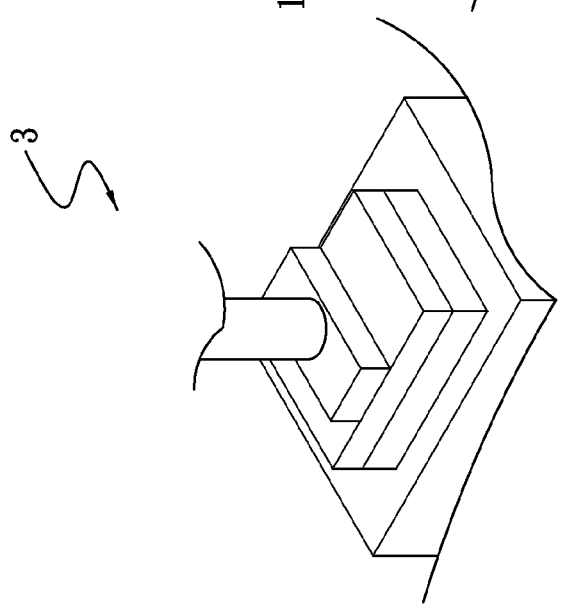
FIG. 8 shows still another step of the manufacturing method of the thermal module of the present invention.

Please refer to FIGS. 4 to 13. FIG. 4 is a flow chart of the manufacturing method of the thermal module of the present invention. FIGS. 5 to 13 show the steps of the manufacturing method of the thermal module of the present invention. Also with reference to FIGS. 1 and 2, the manufacturing method of the thermal module of the present invention includes steps of:

S1: providing a metal board and at least one heat conduction member, a metal board 2 and a heat conduction member 12 being provided, the heat conduction member 12 being a member selected from a group consisting of heat pipe, heat spreader, flat-plate heat pipe and heat conduction metal, in this embodiment, the heat conduction member 12 being, but not limited to, a heat pipe;

S2: primarily punching the metal board to form a first clamping arm and a second clamping arm, the metal board 2 being placed on a punching machine 3 and primarily punched by means of slot punch process to form the first and second clamping arms 111, 112;

S3: secondarily punching the metal board to form a retainer member with a predetermined profile, the metal board 2 being secondarily punched with a punch head 31 of the punching machine 3 by means of laying-off process under a high-speed punching force along the predetermined profile of the retainer 11 to achieve the retainer 11; and S4: placing the heat conduction member on one face of the formed retainer member and applying a force to the first and second clamping arms to bend the first and second clamping arms toward the heat conduction member to tightly hold the heat conduction member and connect the heat conduction member with the retainer member, the heat conduction member 12 being attached to the formed retainer member 11, the first and second clamping arms 111, 112 being then forcedly bent toward the heat conduction member 12 by means of punching to securely hold the heat conduction member 12, alternatively, the first and second clamping arms 111, 112 being then manually forcedly bent toward the heat conduction member 12 by means of a hand tool (not shown) to securely hold the heat conduction member 12.

In this embodiment, the punching process is a stage-by-stage punching process. However, the punching process of the present invention is not limited to the stage-by-by punching process. Alternatively, the punching process can be a continuous punching process.

The thermal module 1 of the present invention has simplified structure and is free from the heat dissipation base seat of the conventional thermal module in contact with the heat source. Therefore, the thermal module of the present invention has much smaller volume and much lighter weight.

By means of the manufacturing method of the thermal module of the present invention, the manufacturing time of the thermal module is shortened and the manufacturing cost of the thermal module is lowered.

The above embodiments are only used to illustrate the present invention, not intended to limit the scope thereof. It is understood that many changes and modifications of the above embodiments can be made without departing from the spirit of the present invention. The scope of the present invention is limited only by the appended claims.

What is claimed is:

1. A manufacturing method of a thermal module, comprising steps of: providing a metal board and at least one heat conduction member;

primarily punching the metal board to form a first clamping arm and a second clamping arm;

secondarily punching the metal board to form a retainer member with a predetermined profile; and placing the heat conduction member on one face of the formed retainer member and applying a force to the first and second clamping arms to bend the first and second clamping arms toward the heat conduction member to tightly hold two lateral sides of the heat conduction member between the first and second clamping arms and connect the heat conduction member with the retainer member, such that a top side of the heat conduction member is flush with or above top ends of the first and second damping arms, and the top side of the conduction member contacts a heat source directly.

2. The manufacturing method of the thermal module as claimed in claim 1, wherein in the step of primarily punching the metal board, the metal board is primarily punched by means of slot punch process.

3. The manufacturing method of the thermal module as claimed in claim 1, wherein in the step of secondarily punching the metal board, the metal board is secondarily punched by means of laying-off process.

4. The manufacturing method of the thermal module as claimed in claim 1, wherein in the step of placing the heat conduction member on one face of the formed retainer member and applying a force to the first and second clamping arms, the heat conduction member is attached to the formed retainer member and then the first and second clamping arms are forcedly bent toward the heat conduction member by means of punching to securely hold the heat conduction member.

5. The manufacturing method of the thermal module as claimed in claim 1, wherein the heat conduction member is selected from a group consisting of heat pipe, heat spreader, flat-plate heat pipe and heat conduction metal.

* * * * *